United States Patent
Yoo et al.

(10) Patent No.: US 8,637,913 B2
(45) Date of Patent: Jan. 28, 2014

(54) NONVOLATILE MEMORY DEVICE AND METHOD FOR FABRICATING THE SAME

(75) Inventors: Hyun-Seung Yoo, Gyeonggi-do (KR); Eun-Seok Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 94 days.

(21) Appl. No.: 13/304,551

(22) Filed: Nov. 25, 2011

(65) Prior Publication Data

US 2012/0299076 A1 Nov. 29, 2012

(30) Foreign Application Priority Data

May 26, 2011 (KR) .................... 10-2011-0049978

(51) Int. Cl.
*H01L 29/78* (2006.01)
*H01L 21/336* (2006.01)

(52) U.S. Cl.
USPC .............. 257/314; 257/E29.262; 257/E21.41; 438/268

(58) Field of Classification Search
USPC .......... 257/314, 324, 335, E29.256, E21.417, 257/E29.262, E21.41; 438/259, 268, 589
See application file for complete search history.

(56) References Cited

U.S. PATENT DOCUMENTS

2013/0069152 A1* 3/2013 Lee et al. ...................... 257/335

* cited by examiner

*Primary Examiner* — Whitney T Moore
(74) *Attorney, Agent, or Firm* — IP & T Group LLP

(57) ABSTRACT

A nonvolatile memory device includes a channel vertically extending from a substrate and comprising a first region that is doped with first impurities and a second region that is disposed under the first region, a plurality of memory cells and a selection transistor stacked over the substrate along the channel, and a diffusion barrier interposed between the first region and the second region, wherein a density of the first impurities is higher than a density of impurities of the second region.

10 Claims, 10 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2011-0049978, filed on May 26, 2011, which is incorporated herein by reference in its entirety.

BACKGROUND

1. Field

Exemplary embodiments of the present invention relate to a nonvolatile memory device and a method for fabricating the same, and more particularly, to a nonvolatile memory device having a three-dimensional structure including a plurality of memory cells that are vertically stacked from a substrate and a method for fabricating the same.

2. Description of the Related Art

A nonvolatile memory device is a memory device where stored data is retained even when power is not supplied. An example of nonvolatile memory devices is a flash memory device.

The degree of integration for a memory device with a two dimensional structure may reach a limit. A three-dimensional structure for a memory device may provide further integration and storage capacity. A three-dimensional structure for a memory device includes a plurality of memory cells stacked along a channel vertically protruding from a silicon substrate and a selection transistor disposed over or under the plurality of memory cells. Since the channel in a three-dimensional memory device structure has a pillar-like shape with a narrow width, wells cannot be formed into various shapes and types as in the memory device with the two-dimensional structure. Therefore, wells are formed by ion-implanting one type of impurities at both ends of the channel. In general, n-type wells are formed by ion-implanting n-type impurities because the mobility of electrons is high.

In a nonvolatile memory device, a positive voltage may be applied to a channel when performing an erase operation. Since a three-dimensional nonvolatile memory device has the pillar-like channel as described above, a voltage transfer delay time corresponding to a minority carrier generation time may result. To avoid minority carrier generation time in the three-dimensional nonvolatile memory device, an erase operation is performed in such a way to induce GIDL (gate induced drain leakage) using a selection transistor. More specifically, by generating a number of electron-hole pairs that implement GIDL, a positive voltage can be quickly transferred to the channel.

Thus, in order to increase the operating speed of a device, a memory device may induce a large amount of GIDL. To induce a large amount of GIDL, the density of the impurities ion-implanted into both ends of a channel, in particular, the density of the impurities in a region adjacent to the edge of the gate of the selection transistor, should be increased.

However, because the channel is generally formed of a polycrystalline semiconductor material, for example, polysilicon, the following features exist when increasing the density of the impurities ion-implanted into both ends of the channel.

Since the impurities ion-implanted into both ends of the channel may diffuse during a subsequent heat-treatment process, maintaining a desired impurity profile may be difficult. Accordingly, the GIDL may not be induced at a desired level, and, therefore, an erase operation may not be able to increase in speed, which may deteriorate the operation characteristics of the device. In addition, since diffused impurities are placed below the gate of the selection transistor, the threshold voltage of the selection transistor is likely to change, which may degrade the reliability of the device.

SUMMARY

Embodiments of the present invention are directed to a nonvolatile memory device and a method for fabricating the same, which forms a region doped with impurities at a high density to a desired depth in the upper end of a channel and may minimize diffusion of doped impurities.

In accordance with an embodiment of the present invention, a nonvolatile memory device includes a channel vertically extending from a substrate, wherein the channel comprises a first region that is doped with first impurities and a second region that is disposed under the first region; a plurality of memory cells and a selection transistor stacked over the substrate along the channel; and a diffusion barrier interposed between the first region and the second region, wherein a density of the first impurities is higher than a density of impurities of the second region.

In accordance with another embodiment of the present invention, a method for fabricating a nonvolatile memory device includes stacking a plurality of memory cells and a selection transistor along a channel that vertically extends from a substrate; forming a trench by removing an upper portion of the channel; forming a diffusion barrier over a bottom of the trench; and forming a semiconductor pattern doped with first impurities over the diffusion barrier in the trench, wherein a density of the first impurities is higher than a density of impurities of the channel.

DETAILED DESCRIPTION

Figure 1:
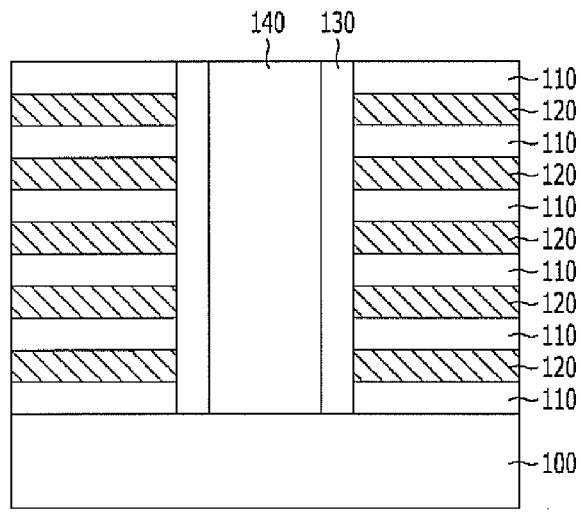
FIGS. 1 to 8 are views illustrating a nonvolatile memory device and a method for fabricating the same in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1 to 8 are views illustrating a nonvolatile memory device and a method for fabricating the same in accordance with an embodiment of the present invention.

Referring to FIG. 1, first interlayer dielectric layers 110 and first conductive layers 120 are alternately stacked on a substrate 100 including a structure (not shown).

The first conductive layers 120 are used as control gate electrodes of a plurality of memory cells in the nonvolatile memory device in accordance with the embodiment of the present invention, and may include, for example, polysilicon. The first interlayer dielectric layers 110 are to isolate the respective first conductive layers 120 from one another, and may include, for example, oxide layers.

While five first conductive layers 120 are shown in the present embodiment, it is noted that the present invention is not limited to five first conductive layers 120, and the number of first conductive layers 120 to be stacked may be increased or decreased.

Subsequent to the forming of the first conductive layers 120 and the first dielectric layers 110, a channel hole exposing the substrate 100 is formed by selectively etching the stack structure of the first interlayer dielectric layers 110 and the first conductive layers 120. After forming the channel hole, a memory layer 130 is formed on the sidewalls of the channel hole, and a first channel 140 is formed to fill the channel hole with the memory layer 130 formed therein.

The memory layer 130 may have a triple-layered structure including a charge blocking layer, a charge trap layer and a tunnel dielectric layer that are sequentially disposed such that the charge blocking layer is closest to the stack structure including the first interlayer dielectric layers 110 and the first conductive layers 120. The memory layer 130 may include, for example, an ONO (oxide-nitride-oxide) layer. The first channel 140 may include a semiconductor material, for example, polysilicon.

Figure 2:
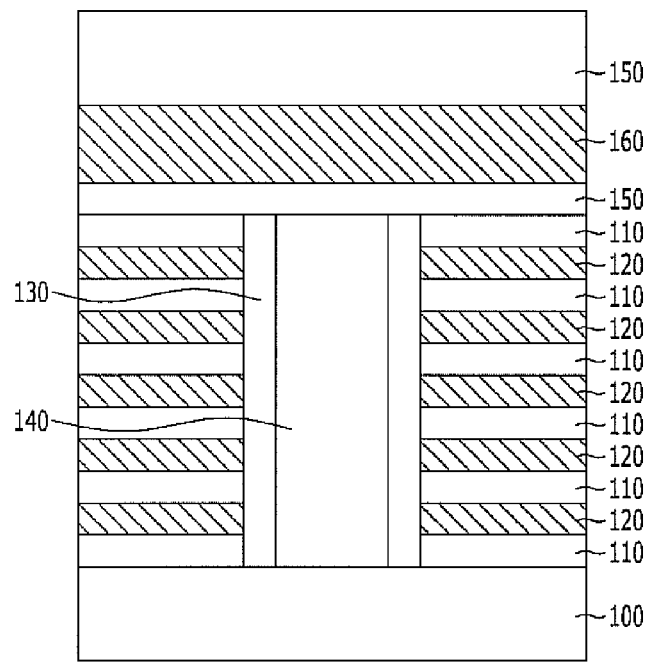

Referring to FIG. 2, a second interlayer dielectric layer 150, a second conductive layer 160, and another second interlayer dielectric layer 150 are sequentially formed on the resultant structure of FIG. 1.

The second conductive layer 160 is used as the gate electrode of an upper selection transistor and may include, for example, polysilicon. The second interlayer dielectric layers 150 are formed to isolate the second conductive layer 160 and may include, for example, oxide layers.

Figure 3:
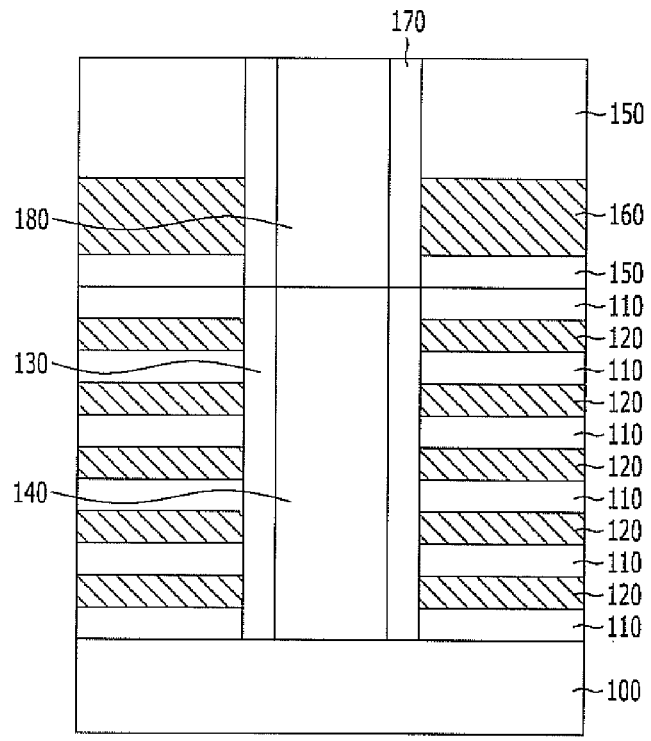

Referring to FIG. 3, a second channel hole is formed by selectively etching the second interlayer dielectric layers 150 and the second conductive layer 160 to expose the first channel 140 and the memory layer 130 surrounding the first channel 140. After forming the second channel hole, a gate dielectric layer 170 is formed on the sidewall of the second channel hole, and a second channel 180 is formed to fill the channel hole with the gate dielectric layer 170 formed therein.

The gate dielectric layer 170 may include a gate oxide layer. The second channel 180 may include a semiconductor material, for example, polysilicon. The second channel 180 may be integrally connected with the first channel 140.

Although FIGS. 1 to 3 describe that a plurality of memory cells are formed along the first channel 140 and a selection transistor is subsequently formed on the plurality of memory cells, the present invention is not limited to the above described method and the sequence of processes may be modified. For example, one channel may be formed by selectively etching the stack structure of the first interlayer dielectric layers 110 and the first conductive layers 120 and the stack structure of the second interlayer dielectric layers and the second conductive layer 160. In this embodiment, a memory layer may be interposed, for example, not only between the first conductive layers 120 and the channel but also between the second conductive layer 160 and the channel. Also, the portion of the memory layer interposed between the second conductive layer 160 and the channel may serve as a gate dielectric layer.

Figure 4:
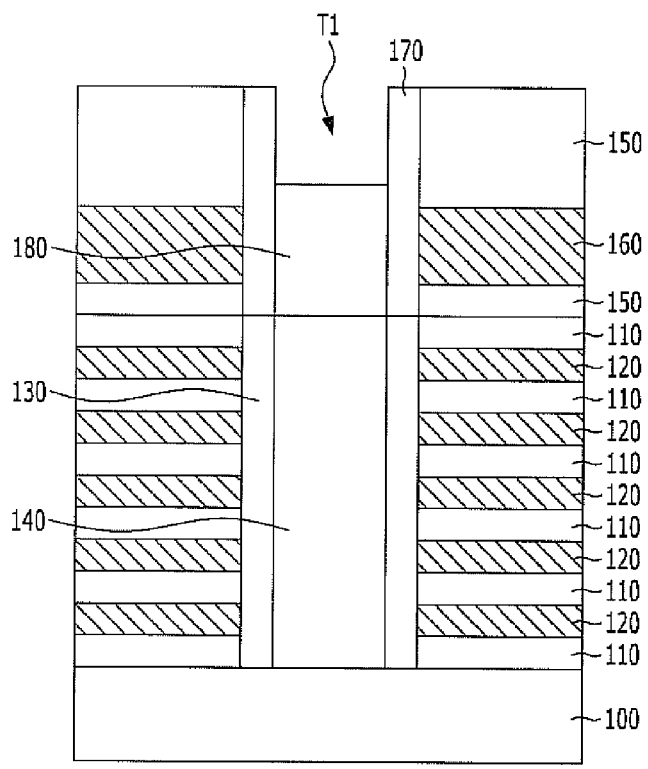

Referring to FIG. 4, a first trench T1 with a designated depth is formed by removing an upper portion of the second channel 180.

The first trench T1 may have a variety of different depths depending upon the characteristics of a device. In the present embodiment, the depth of the first trench T1 may be at a depth that the bottom of the first trench T1 is placed slightly higher than the upper surface of the second conductive layer 160. However, the present embodiment is not limited to the above described depth of the first trench T1, and another embodiment may form the first trench T1 to a depth such that the bottom of the first trench T1 may be the same depth as the upper surface of the second conductive layer 160, or to a depth between the upper and lower surfaces of the second conductive layer 160 (see FIG. 11).

A process for forming the first trench T1 may be performed through isotropic etching or unisotropic etching of the upper portion of the second channel 180.

Figure 5:
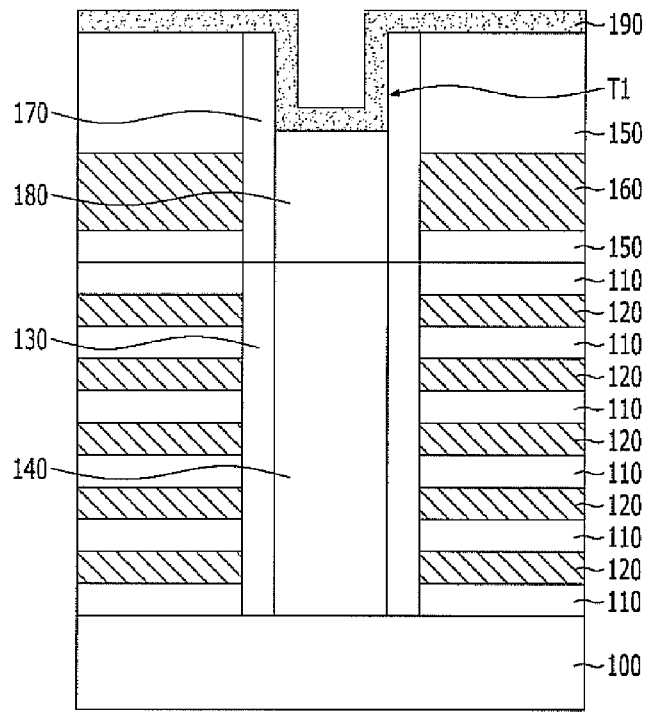

Referring to FIG. 5, a diffusion barrier layer 190 is deposited on the entire surface of the resultant structure of FIG. 4. By depositing the diffusion barrier layer 190, the upper surface of the second channel 180 within the first trench T1 is covered by the diffusion barrier layer 190. The diffusion barrier layer 190 prevents diffusion of impurities doped at a high density, which will be described later in detail.

The diffusion barrier layer 190 may include a conductive material, for example, a metal, a metal oxide, or a metal nitride. More specifically, an aluminum oxide layer (Al2O3) may be deposited to form the diffusion barrier layer 190, and a heat treatment may be additionally performed on the diffusion barrier layer 190 to render conductivity after deposition. Otherwise, the diffusion barrier layer 190 may include a dielectric material with a small thickness so that tunneling of charges is possible.

Figure 6:
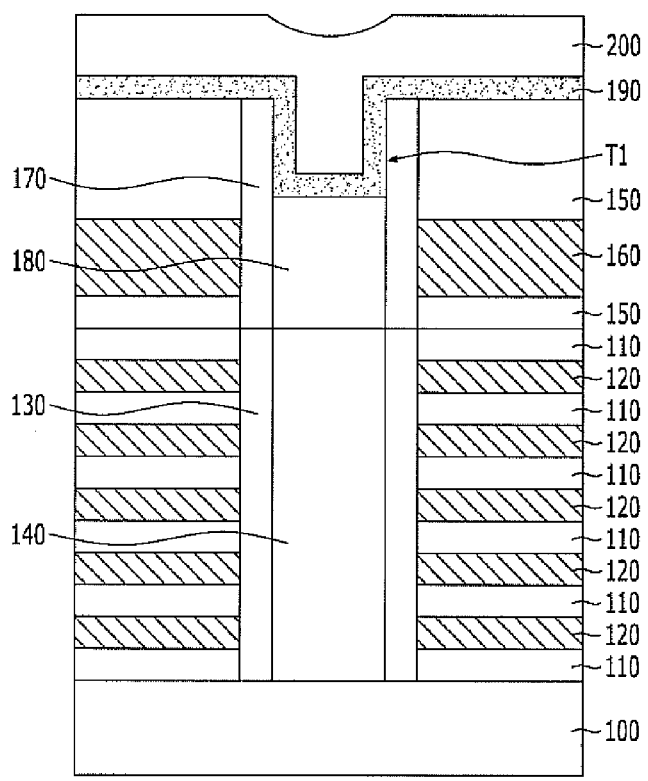

Referring to FIG. 6, a semiconductor layer 200 doped with impurities at a high density is deposited on the diffusion barrier layer 190 to a designated thickness, for example, a thickness filling the first trench T1.

The semiconductor layer 200 doped with impurities at the high density may include, for example, a polysilicon layer doped with n-type impurities. "High density" may mean a density that may maximize the occurrence of GIDL in an erase operation of the nonvolatile memory device in accordance with the embodiment of the present invention. "High density" also may mean an impurity doping density at least higher than the density of the first and second channels 140 and 180.

Figure 7:
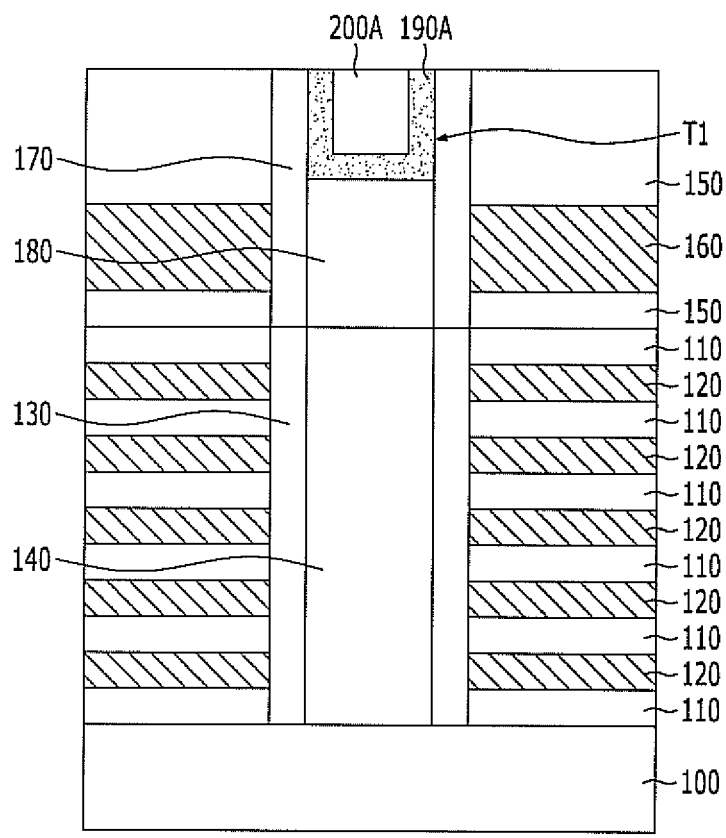

Referring to FIG. 7, a planarization process, for example, a CMP (chemical mechanical polishing) process, is performed until the upper surface of the uppermost second interlayer dielectric layer 150 is exposed.

As a result of the planarization process, a diffusion barrier pattern 190A is formed on the bottom and the sidewall of the first trench T1, and a semiconductor pattern 200A fills the trench T1 with the diffusion barrier pattern 190A formed therein. As described above, the semiconductor pattern 200A is doped with impurities at the high density.

Since the diffusion barrier pattern 190A is interposed between the second channel 180 and the semiconductor pattern 200A, a minimum amount of the impurities doped into the semiconductor pattern 200A at the high density diffuse into the second channel 180.

Figure 8:
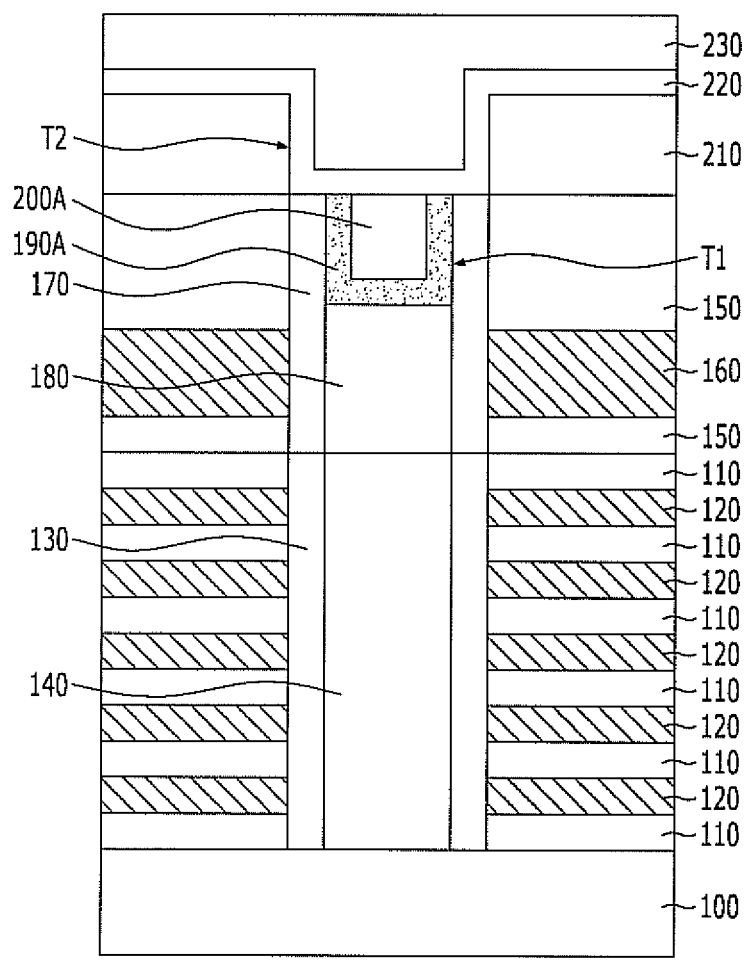

Referring to FIG. 8, a third interlayer dielectric layer 210 is formed on the resultant structure of FIG. 7. A second trench T2 is formed by selectively etching the third interlayer dielectric layer 210 to expose a region where the channels 140 and 180 are formed. The second trench T2 defines a region where a wiring line to be connected to the channels 140 and 180 is to be formed.

Subsequently, a diffusion barrier 220 is formed on the entire surface of the resultant structure including the third interlayer dielectric layer 210 and the second trench T2. The diffusion barrier 220 may include a metal layer, a metal oxide layer, or a metal nitride layer. However, forming the diffusion barrier 220 may be omitted.

Subsequently to forming the diffusion barrier 220, a wiring line 230 is formed by depositing a conductive material on the diffusion barrier 220 to fill the trench T2 to connect with the semiconductor pattern 200A formed over the channels 140 and 180. The wiring line 230 may be connected to the semiconductor pattern 200A directly or via the diffusion barrier 220. The wiring line 230 may include a metal layer, a metal oxide layer, or a metal nitride layer.

In the present embodiment as described above, since a high density impurity doping region in an upper end of a channel corresponds to the semiconductor pattern 200A, it is easier to control the depth of the high density impurity doping region than implementing control through ion implantation. Further, since the impurities doped into the semiconductor pattern 200A at the high density are prevented from diffusing into the second channel 180 because the diffusion barrier pattern 190A is interposed between the semiconductor pattern 200A and the underlying second channel 180, the nonvolatile memory device may be more reliable and have improved operation characteristics. These characteristics will be described below in detail with reference to FIGS. 9A to 10B.

Figure 9A:
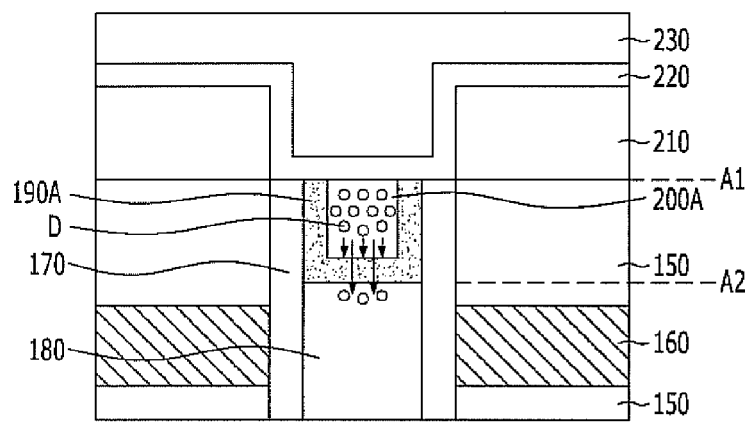
FIGS. 9A to 9C are views and a graph comparing and illustrating an impurity diffusion degree in a nonvolatile memory device according to an exemplary embodiment of the present invention and an impurity diffusion degree in a nonvolatile memory device according to a comparative example.
Figure 9B:
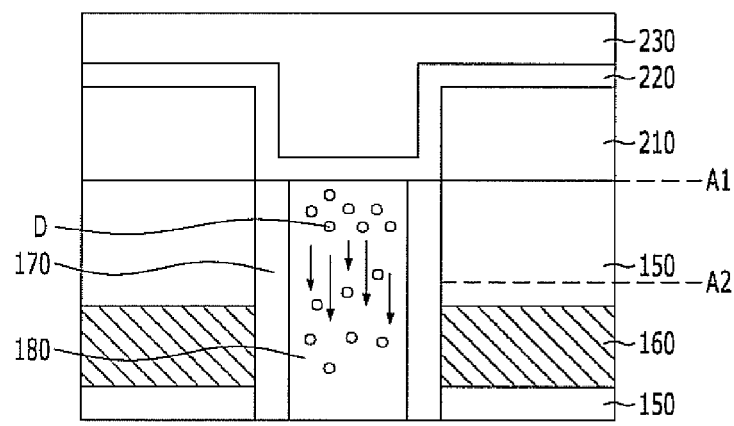
Figure 9C:
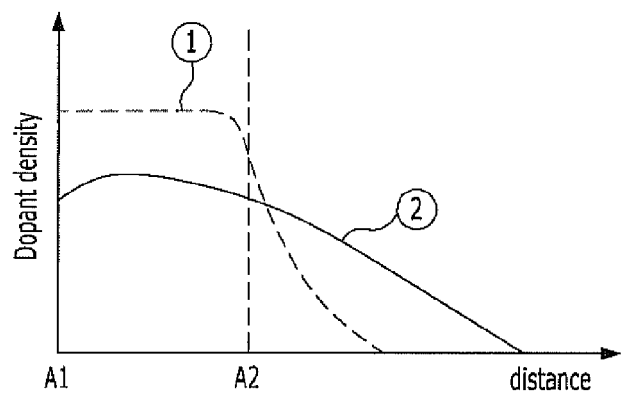

FIGS. 9A to 9C are views and a graph comparing and illustrating an impurity diffusion degree in a nonvolatile memory device according to the present invention and an impurity diffusion degree in a nonvolatile memory device according to a comparative example. More specifically, FIG. 9A shows a nonvolatile memory device and an impurity diffusion degree thereof according to an exemplary embodiment of the present invention, FIG. 9B shows a nonvolatile memory device and an impurity diffusion degree thereof according to a comparative example, and FIG. 9C is a graph showing an impurity doping density according to a depth in the embodiment of the present invention and in the comparative example. In these drawings, a memory cell portion is not shown.

Referring to FIG. 9A, where the diffusion barrier pattern 190A is formed between the semiconductor pattern 200A doped with the impurities at the high density and the channel 180, diffusion of doped impurities D is minimized and partly diffused impurities D are concentrated on the interface between the diffusion barrier pattern 190A and the underlying channel 180.

The results of the structure of FIG. 9A are illustrated by the line ① in FIG. 9C. More specifically, when designating the depth of the uppermost surface of the channel to be at the line A1 and designating the depth of the interface between the diffusion barrier pattern 190A and the underlying channel 180 to be at the line A2, an impurity doping density is substantially constant in the region between A1 and A2 and abruptly decreases as a depth increases beyond A2. Even where a depth increases beyond A2, impurities are substantially concentrated adjacent to the depth A2.

Conversely, referring to FIG. 9B, in a comparative example where a diffusion barrier is not formed and impurities are doped into the upper end of the channel 180 at a high density through ion implantation, the doped impurities D easily diffuse downward, and may diffuse even below the gate 160 of the selection transistor.

The results of the structure of FIG. 9B are illustrated by the line ② in FIG. 9C. More specifically, an impurity doping density is lower than line ① in the region between A1 and A2 and gradually decreases as a depth increases beyond A2. In other words, impurities are present at a depth far greater than A2.

As a consequence, in the embodiment of the present invention, since diffusion of impurities is minimized and an impurity doping profile is maintained in a desired region, occurrence of GIDL can be increased. In addition, the impurities D that have diffused through the diffusion barrier pattern 190A are concentrated at the interface between the diffusion barrier pattern 190A and the underlying channel 180 and contribute to formation of an ohmic junction between the diffusion barrier pattern 190A and the underlying channel 180 and to the occurrence of GIDL.

Figure 10A:
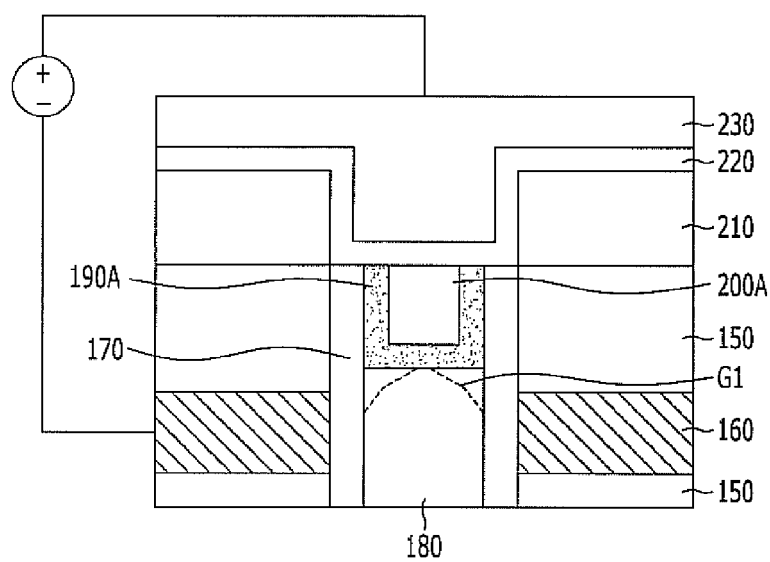
FIGS. 10A and 10B are views comparing and illustrating a GIDL occurring region in the nonvolatile memory device according to the exemplary embodiment of the present invention and a GIDL occurring region in the nonvolatile memory device according to the comparative example.
Figure 10B:
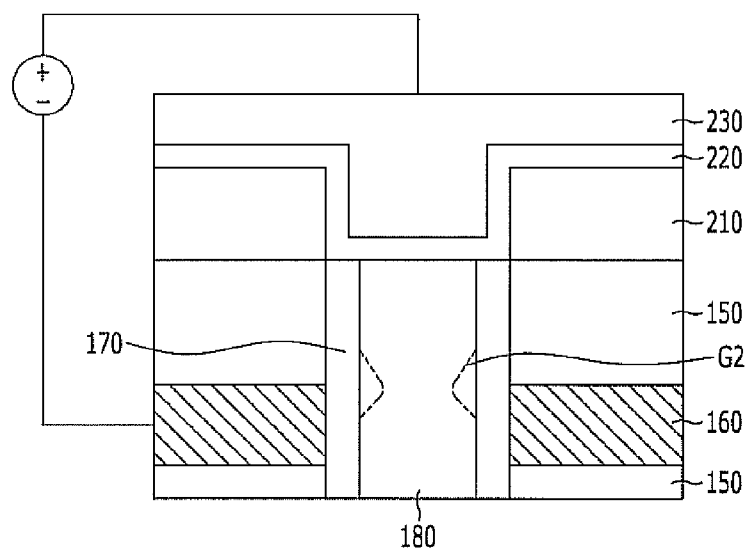

FIGS. 10A and 10B are views comparing and illustrating a GIDL occurring region in the nonvolatile memory device according to the present invention and a GIDL occurring region in the nonvolatile memory device according to the comparative example. More specifically, FIG. 10A shows a GIDL occurring region in the nonvolatile memory device according to the embodiment of the present invention, and FIG. 10B shows a GIDL occurring region in the nonvolatile memory device according to the comparative example. In these drawings, a memory cell portion is not shown.

Referring to FIG. 10A, the diffusion barrier pattern 190A is formed, for example, using a conductive material. Since the diffusion barrier pattern 190A can also perform a function similar to the gate 160 of the selection transistor, regions of the channel 180 that correspond to the reference symbol G1 may serve as GIDL-occurring regions. The regions of the channel G1 are regions that extend from the drain side's edge of the gate 160 of the selection transistor to a portion which adjoins the diffusion barrier pattern 190.

Conversely, referring to FIG. 10B, a diffusion barrier is not formed in the comparative example. Regions of the channel 180 that correspond to the reference symbol G2, which adjoin the drain side's edge of the gate 160 of the selection transistor, may serve as GIDL-occurring regions.

Accordingly, the area of the GIDL-occurring regions G1 is larger, and occurrence of GIDL increases in the present embodiment when compared to the comparative example. In the embodiment of the present invention, since the doped impurities are concentrated in the region between A1 and A2, the density of impurities contributing to occurrence of GIDL in the GIDL-occurring regions G1 becomes relatively high. Conversely, in the comparative example, since diffusion of impurities occurs randomly, it is difficult to control the density of the impurities contributing to occurrence of GIDL in the GIDL-occurring regions G2.

Figure 11:
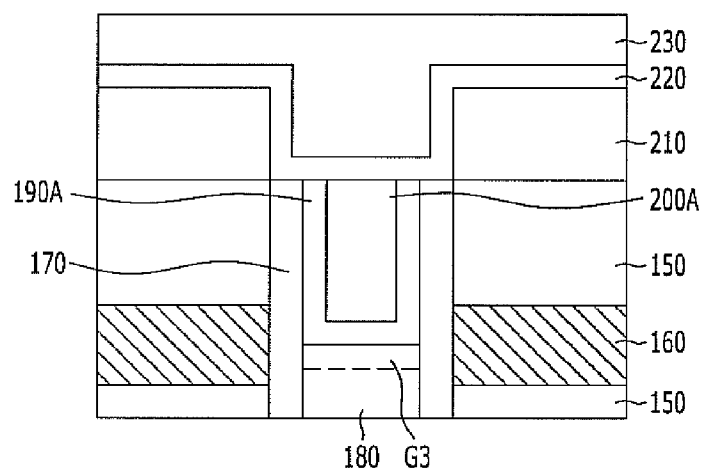
FIG. 11 is a view illustrating a nonvolatile memory device in accordance with another embodiment of the present invention.

FIG. 11 is a view illustrating a nonvolatile memory device in accordance with another embodiment of the present invention. In this drawing, a memory cell portion is not shown.

Referring to FIG. 11, the present embodiment shown in FIG. 11 is differentiated from the aforementioned embodiment shown in FIG. 8 in that the depth of the first trench T1 is to such a depth that the bottom of the first trench T1 is placed between the upper and lower surfaces of the second conductive layer 160. The other component elements of the present embodiment are the same as those of the aforementioned embodiment shown.

In the present embodiment, a GIDL-occurring region G3 may correspond to an interface region between the diffusion barrier pattern 190A and the second channel 180.

Accordingly, the present embodiment is similar to the aforementioned embodiment. More specifically, the present embodiment and the aforementioned embodiment are similar because the area of the GIDL-occurring region G3 is relatively large and the density of impurities contributing to occurrence of GIDL in the GIDL-occurring region G3 is high.

The above-described embodiments may be applied to three-dimensional nonvolatile memory devices with various structures and methods for fabricating the same. Hereafter, exemplary descriptions will be given with reference to FIGS. 12 to 15.

FIGS. 12 to 15 are views illustrating a nonvolatile memory device and a method for fabricating the same in accordance with another embodiment of the present invention. In describing the present embodiment, similarities to the aforementioned embodiments will be described simply, and differences will be described in more detail.

Figure 12:
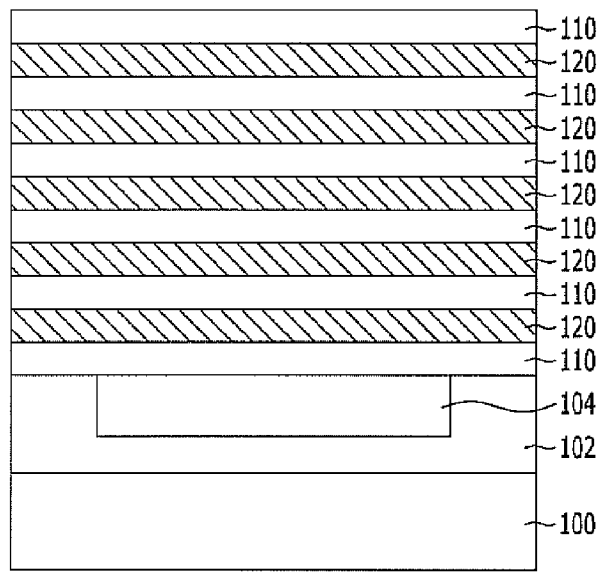
FIGS. 12 to 15 are views illustrating a nonvolatile memory device and a method for fabricating the same in accordance with further another embodiment of the present invention.

Referring to FIG. 12, a pipe gate electrode layer 102 with a sacrificial layer 104 embedded therein is formed on a substrate 100.

The pipe gate electrode layer 102 serves as the gate electrode of a pipe transistor, which will be described later, and may include, for example, polysilicon doped with impurities. The sacrificial layer 104 defines a region where the channel of the pipe transistor is to be formed and may include a dielectric layer, such as an oxide layer or a nitride layer.

Subsequently, the alternate stack structure of first interlayer dielectric layers 110 and first conductive layers 120 is formed on the pipe gate electrode layer 102 with the sacrificial layer 104 embedded therein.

Figure 13:
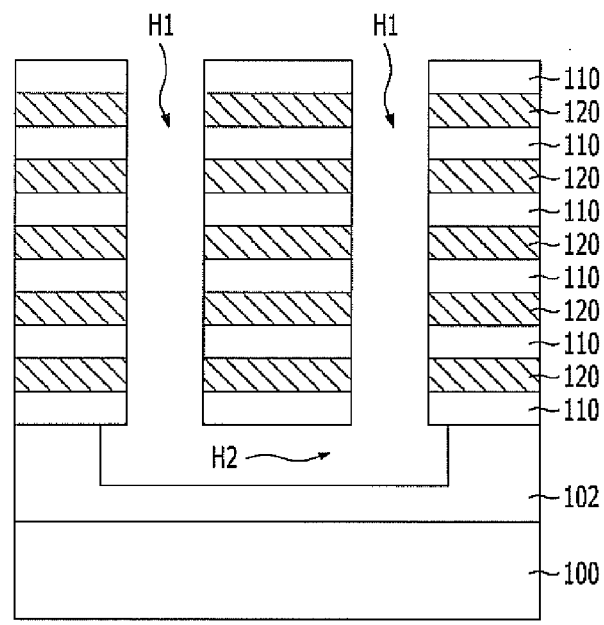

Referring to FIG. 13, a pair of first channel holes H1 is formed through the stack structure of the first interlayer dielectric layers 110 and the first conductive layers 120 to expose the sacrificial layer 104. After forming the first channel holes H1, the sacrificial layer 104 exposed through the first channel holes H1 is removed. A process for removing the sacrificial layer 104 may be performed, for example, through wet etching.

As a result of removing the sacrificial layer, the pair of first channel holes H1 and a pipe channel hole H2, which connects the pair of first channel holes H1 with each other are formed. The pair of first channel holes H1 and the pipe channel hole H2 define a U-shape structure.

Figure 14:
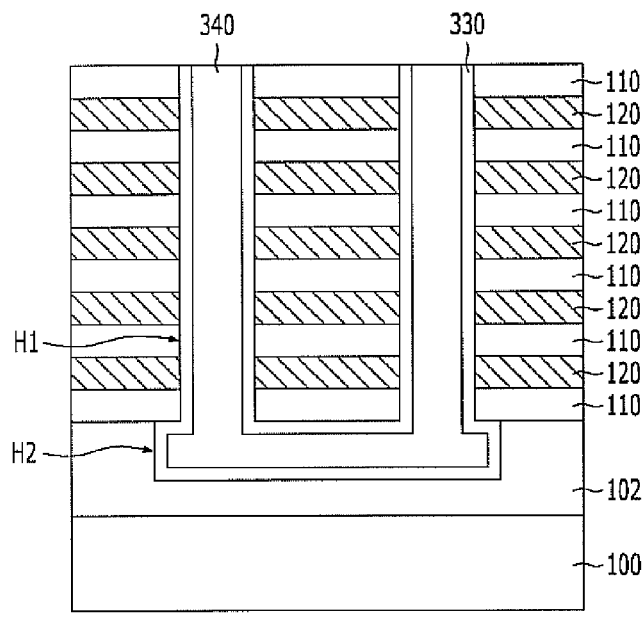

Referring to FIG. 14, a memory layer 330 is formed on the walls of the first channel holes H1 and the walls of the pipe channel hole H2, and a first channel 340 is formed by filling the first channel holes H1 and the pipe channel hole H2 with the memory layer 330 formed on the walls thereof. The memory layer 330 and the first channel 340 may be formed using the same materials and through the same processes as the memory layer 130 and the first channel 140 of the aforementioned embodiments shown in FIG. 8 and FIG. 11.

Figure 15:
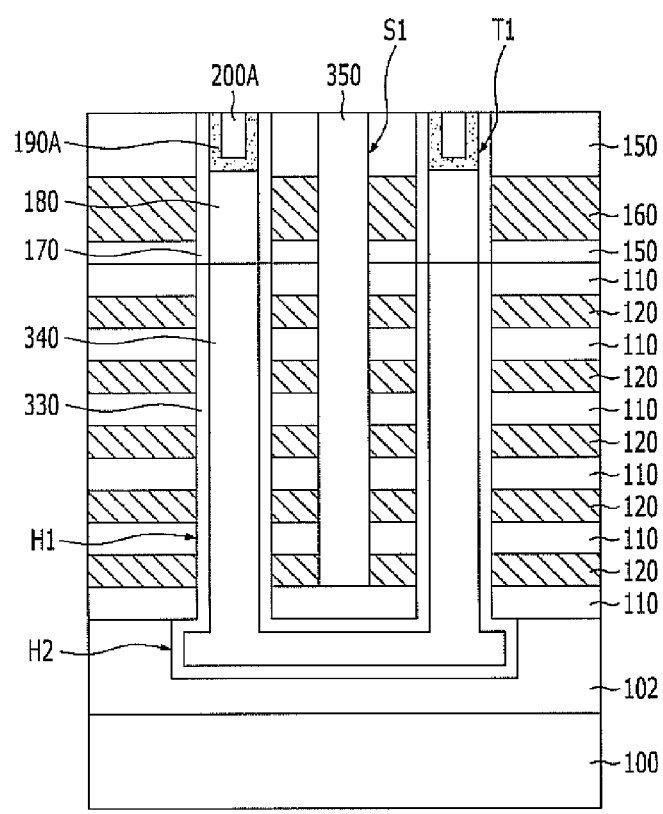

Referring to FIG. 15, subsequent processes are substantially the same as those described with reference to FIGS. 2 to 7. More specifically, a second interlayer dielectric layer 150, a second conductive layer 160 and a second interlayer dielectric layer 150 are sequentially formed on the resultant structure of FIG. 14. A pair of second channel holes exposing the first channel 340 and the memory layer 330 is formed by selectively etching the second interlayer dielectric layers 150 and the second conductive layer 160. After forming the second channel holes, a gate dielectric layer 170 and second channels 180 are formed in the pair of second channel holes. Subsequently, first trenches T1 with a predetermined depth are formed by removing upper portions of the second channels 180. Next, diffusion barrier patterns 190A are formed on the bottom and the sidewalls of the first trenches T1, and semiconductor patterns 200A are formed in the first trenches T1 with the diffusion barrier patterns 190A formed therein.

After forming the semiconductor patterns 200A, the second interlayer dielectric layers 150, the second conductive layer 160, the first interlayer dielectric layers 110 and the first conductive layers 120 between the pair of first channel holes H1 and between the pair of second channel holes are selectively etched to form a slit S1 to separate the first conductive layers 120 and the second conductive layer 160 between the pair of first channel holes H1 and between the pair of second channel holes. An etching process for forming the slit S1 may be performed using the lowermost first interlayer dielectric layer 110 as an etch stop layer.

Next, a dielectric material 350 is filled in the slit S1.

In succession, while not shown in a drawing, a first wiring line (for example, a source line) connected with any one of the pair of semiconductor patterns 200A and a second wiring line (for example, a bit line) connected with the other semiconductor pattern 200A may be additionally formed.

Through the above-described processes, a nonvolatile memory device, which includes a pair of vertical channels in a U-shape connected by a pipe channel transistor and a plurality of memory cells, may be formed. The method for fabricating the nonvolatile memory device of the current embodiment accords similar working effects and features to those of the aforementioned embodiments.

Further, while not shown in any of the figures, the method for fabricating a nonvolatile memory device may be modified. For example, the first conductive layer 120 may be replaced with a first sacrificial layer, and the second conductive layer 160 may be replaced with a second sacrificial layer. The remaining process follows the processes of the aforementioned embodiment that forms the U-shaped nonvolatile memory device, except that before filling the slit S1 with the dielectric material 350, the first and second sacrificial layers exposed by the slit S1 are removed, and a conductive material is filled in the spaces created by removing the sacrificial layers. After forming the conductive material is filled in the spaces, the slit S1 is filled with the dielectric material 350, as discussed in the previous embodiment.

As is apparent from the above descriptions, the nonvolatile memory device and the method for fabricating the same according to the embodiments of the present invention provide advantages in that a region doped with impurities at a high density to a desired height on the upper end of a channel can be easily formed and diffusion of the doped impurities is minimized.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
a channel vertically extending from a substrate;
a semiconductor pattern doped with first impurities and disposed over the channel;
a plurality of memory cells and a selection transistor stacked over the substrate along the channel; and
a diffusion barrier interposed between the channel and the semiconductor pattern, wherein a density of the first impurities is higher than a density of impurities of the channel.

2. The nonvolatile memory device of claim 1, wherein the diffusion barrier covers a side of the semiconductor pattern.

3. The nonvolatile memory device of claim 1, wherein the diffusion barrier is formed of a conductive material.

4. The nonvolatile memory device of claim 1, wherein the diffusion barrier is formed of a dielectric material with a thickness capable of tunneling of charges.

5. The nonvolatile memory device of claim 1, wherein the semiconductor pattern is formed of polysilicon.

6. The nonvolatile memory device of claim 1, wherein the first impurities are n-type impurities.

7. The nonvolatile memory device of claim 1, wherein a lower surface of the semiconductor pattern is higher than an upper surface of a gate of the selection transistor.

8. The nonvolatile memory device of claim 1, wherein a lower surface of the semiconductor pattern is same as an upper surface of a gate of the selection transistor or is lower than the upper surface of the gate of the selection transistor and higher than a lower surface of the gate of the selection transistor.

9. The nonvolatile memory device of claim 1, wherein the channel includes a pair of channels, and wherein the pair of channels are connected with each other by a connection channel that is disposed under lower ends of the pair of channels.

10. The nonvolatile memory device of claim 1, further comprising: gate induced drain leakage occurring regions that extend from a drain side edge of a gate of the selection transistor to the diffusion barrier.

* * * * *